(12) United States Patent
Mizuno et al.

(10) Patent No.: US 8,085,512 B2
(45) Date of Patent: ***Dec. 27, 2011

(54) CPP-TYPE MAGNETORESISTANCE EFFECT ELEMENT HAVING A PAIR OF FREE LAYERS

(75) Inventors: Tomohito Mizuno, Tokyo (JP); Yoshihiro Tsuchiya, Tokyo (JP); Shinji Hara, Tokyo (JP); Koji Shimazawa, Tokyo (JP); Tsutomu Chou, Tokyo (JP)

(73) Assignee: TDK Corporation (JP)

( * ) Notice: Subject to any disclaimer, the term of this patent is extended or adjusted under 35 U.S.C. 154(b) by 930 days.

This patent is subject to a terminal disclaimer.

(21) Appl. No.: 12/045,927

(22) Filed: Mar. 11, 2008

(65) Prior Publication Data

US 2009/0059442 A1 Mar. 5, 2009

Related U.S. Application Data

(63) Continuation-in-part of application No. 11/847,521, filed on Aug. 30, 2007.

(51) Int. Cl.
*G11B 5/39* (2006.01)
(52) U.S. Cl. .................................. 360/324.12
(58) Field of Classification Search .......... 360/324.1, 360/324.11, 324.12, 324.2
See application file for complete search history.

(56) References Cited

U.S. PATENT DOCUMENTS

| | | | |
|---|---|---|---|
| 6,169,647 B1 | 1/2001 | Mao et al. | |
| 6,914,759 B2 | 7/2005 | Chen et al. | |
| 7,019,371 B2 | 3/2006 | Seigler | |
| 7,035,062 B1 | 4/2006 | Mao et al. | |
| 2002/0075611 A1* | 6/2002 | Seigler et al. | 360/324 |
| 2003/0179520 A1* | 9/2003 | Hasegawa | 360/324.12 |
| 2006/0232892 A1* | 10/2006 | Covington et al. | 360/324 |
| 2007/0097561 A1 | 5/2007 | Miyauchi et al. | |
| 2009/0237839 A1* | 9/2009 | Hirata et al. | 360/234.3 |
| 2009/0257153 A1* | 10/2009 | Liu | 360/324.12 |
| 2010/0097729 A1* | 4/2010 | Gill et al. | 360/324 |

FOREIGN PATENT DOCUMENTS

| | | |
|---|---|---|
| JP | 2003-8102 | 1/2003 |
| JP | 2003-298143 | 10/2003 |
| JP | 2004-39869 | 2/2004 |
| JP | 2007-150254 | 6/2007 |

* cited by examiner

*Primary Examiner* — Jefferson Evans
(74) *Attorney, Agent, or Firm* — Knobbe Martens Olson & Bear LLP (57) ABSTRACT

A magnetic field detecting element comprises: a stack which includes first, second and third magnetic layers whose magnetization directions depend upon an external magnetic field, the second magnetic layer being positioned between the first magnetic layer and the third magnetic layer, a first non-magnetic intermediate layer sandwiched between the first magnetic layer and the second magnetic layer, and a second non-magnetic intermediate layer sandwiched between the second magnetic layer and the third magnetic layer, wherein the stack is adapted such that sense current flows in a direction that is perpendicular to a film surface thereof; and a bias magnetic layer which is provided on a side of the stack, the side being opposite to an air bearing surface of the stack.

11 Claims, 9 Drawing Sheets

CPP-TYPE MAGNETORESISTANCE EFFECT ELEMENT HAVING A PAIR OF FREE LAYERS

CROSS-REFERENCE TO RELATED APPLICATIONS

This application is a continuation-in-part of U.S. patent application Ser. No. 11/847,521, filed Aug. 30, 2007, the disclosure of which is herein incorporated by reference in its entirety.

BACKGROUND OF THE INVENTION

1. Field of the Invention

The present invention relates to a magnetic field detecting element, and more particularly to the element structure of a magnetic field detecting element having a pair of free layers.

2. Description of the Related Art

As a reproduction element of a thin film magnetic head, GMR (Giant Magneto Resistance) elements are known. Hitherto, CIP (Current In Plane)-GMR element, in which sense current flows in a direction that is horizontal to the film surface of the element, have been mainly used. In recent years, however, in order to cope with higher recording density, elements have been developed in which sense current flows in a direction that is perpendicular to the film surface of the element. TMR elements utilizing the TMR (Tunnel Magneto-Resistance) effect, and CPP (Current Perpendicular to the Plane) elements utilizing the GMR effect are known as the elements of this type. In this specification, an element in which sense current flows in a direction that is perpendicular to the film surface of the element is generally referred to as a CPP-type element.

Conventionally, the CPP element includes a stack having a magnetic layer (free layer) whose magnetization direction changes in accordance with an external magnetic field, a magnetic layer (pinned layer) whose magnetization direction is fixed with respect to the external magnetic field, and a non-magnetic intermediate layer sandwiched between the pinned layer and the free layer. On both sides of the stack with regard to the track width direction, bias magnetic layers for applying a bias magnetic field to the free layer are provided. The free layer is magnetized into a single magnetic state by a bias magnetic field emitted from the bias magnetic layers. This provides an improvement in linearity of a change in resistance in accordance with a change in an external magnetic field, and an effective reduction in Barkhausen noise. A relative angle between the magnetization direction of the free layer and the magnetization direction of the pinned layer changes in accordance with an external magnetic field, and as a result, electric resistance of sense current that flows in a direction perpendicular to the film surface of the stack is changed. By making use of this property, external magnetization is detected. The stack is magnetically shielded by shield layers on both sides thereof with regard to the direction of stacking.

In recent years, higher track recording density is desired. However, an improvement in track recording density requires a reduction in the spacing between upper and lower shield layers (a gap between shields). In order to achieve this, a decrease in thickness of the stack is required. However, there is a large limitation that originates from the layer configuration in the conventional CPP-type elements. Specifically, since the pinned layer requires that the magnetization direction be firmly fixed without being influenced by an external magnetic field, a so-called synthetic pinned layer is usually used. The synthetic pinned layer includes an outer pinned layer, an inner pinned layer, and a non-magnetic intermediate layer which consists of Ru or Rh and which is sandwiched between the outer pinned layer and the inner pinned layer. Moreover, an antiferromagnetic layer is provided in contact with the outer pinned layer in order to fix the magnetization direction of the outer pinned layer. The antiferromagnetic layer typically consists of IrMn. In the synthetic pinned layer, the antiferromagnetic layer is coupled to the outer pinned layer via exchange-coupling so that the magnetization direction of the outer pinned layer is fixed. The inner pinned layer is antiferromagnetically coupled to the outer pinned layer via the non-magnetic intermediate layer so that the magnetization direction of the inner pinned layer is fixed. Since the magnetization directions of the inner pinned layer and the outer pinned layer are anti-parallel to each other, magnetization of the pinned layer is limited as a whole. Despite such a merit of the synthetic pinned layer, however, a large number of layers are required to constitute a CPP-type element that includes the synthetic pinned layer. This imposes limitation on a reduction in the thickness of the stack.

Meanwhile, a novel layer configuration that is entirely different from that of the above-mentioned conventional stack has been proposed in recent years. In U.S. Pat. No. 7,019,371, a stack used for the CIP element, which includes two free layers and a non-magnetic intermediate layer that is sandwiched between the free layers, is disclosed. In U.S. Pat. No. 7,035,062, a stack used for the CPP-type element, which includes two free layers and a non-magnetic intermediate layer that is sandwiched between the free layers, is disclosed. In these elements, two free layers are exchange-coupled via a non-magnetic intermediate layer due to the RKKY (Rudermann, Kittel, Kasuya, Yoshida) interaction. A bias magnetic layer is provided on the side of the stack that is opposite to the air bearing surface, and a bias magnetic field is applied in a direction that is perpendicular to the air bearing surface. The magnetization directions of the two free layers adopt a certain relative angle because of the magnetic field applied from the bias magnetic layer. If an external magnetic field is applied from a recording medium in this state, then the magnetization directions of the two free layers are changed. As a result, the relative angle between the magnetization directions of the two free layers is changed, and accordingly, electric resistance of sense current is changed. By making use of such a property, it becomes possible to detect an external magnetic field. Such a layer configuration using two free layers has the potential for facilitating a reduction in the gap between the shield layers, because it does not require a conventional synthetic pinned layer and a antiferromagnetic layer and allows a simplified layer configuration.

In such an element that uses two free layers, the requirement is that the non-magnetic intermediate layer not only produces magnetoresistance effect, but also causes the two free layers to be coupled in an anti-parallel manner by the RKKY interaction. As a material to satisfy such a requirement, a metallic material, such as Cu, can be preferably used.

However, if a metallic material, such as Cu, is used, then a large amount of sense current flows in the stack because of small electric resistance of the non-magnetic intermediate layer. This causes the problem in which it is difficult for the relative angle between free layers to be changed by an external magnetic field due to the spin-torque effect. The spin-torque effect refers to the phenomenon that spin-polarized electrons are injected into the free layer so that the magnetization state of the free layer is disturbed. This phenomenon leads to deterioration in response of an element to an external magnetic field. Since the spin-torque effect becomes more pronounced in accordance with an increase in the density of sense current, it is necessary to limit the spin-torque effect by using a semiconductor material, such as MgO, ZnO, or an insulating material, such as AlO, as the non-magnetic intermediate layer, in order to lower current density. However, these materials do not necessarily have the property to produce a RKKY interaction. Moreover, even if these materials have the property, it is necessary for the non-magnetic intermediate layer to have a specific thickness to produce the RKKY interaction. However, a sufficient magnetoresistance effect is not necessarily obtained with a specific thickness. As an example, it is reported that when MgO is used as the non-magnetic intermediate layer, weak RKKY interaction (exchange-coupling constant $2.6 \times 10^{-12}$ J/m$^2$) is obtained with a thickness of 0.6 nm. However, this thickness does not provide a magnetoresistance ratio having a practical level. Thus, in the CPP-type element using two free layers, there are large limitations on the selection of material and thickness of the non-magnetic intermediate layer, leading to a difficulty in obtaining a sufficient magnetoresistance ratio while limiting the spin-torque effect.

SUMMARY OF THE INVENTION

The present invention is directed to a CPP type magnetic field detecting element having a layer configuration that includes a stack with more than one free layer and that has a bias magnetic layer that is located on the back side of the stack when viewed from the air bearing surface. An object of the present invention is to provide a magnetic field detecting element having the above-mentioned layer configuration that exhibits a high magnetoresistance effect and that is capable of reducing the gap between the shields, while limiting the spin-torque effect.

According to an embodiment of the present invention, a magnetic field detecting element comprises: a stack which includes first, second and third magnetic layers whose magnetization directions change in accordance with an external magnetic field, the second magnetic layer being positioned between the first magnetic layer and the third magnetic layer, a first non-magnetic intermediate layer which is sandwiched between the first magnetic layer and the second magnetic layer, the first non-magnetic intermediate layer producing a magnetoresistance effect between the first magnetic layer and the second magnetic layer, and a second non-magnetic intermediate layer which is sandwiched between the second magnetic layer and the third magnetic layer, the second non-magnetic intermediate layer allowing the second magnetic layer and the third magnetic layer to be exchange-coupled such that magnetization directions thereof are anti-parallel to each other under no magnetic field, the stack being adapted such that sense current flows in a direction that is perpendicular to a film surface thereof; and a bias magnetic layer which is provided on a side of the stack, the side being opposite to an air bearing surface of the stack, the bias magnetic layer applying a bias magnetic field to the stack in a direction that is perpendicular to the air bearing surface.

The inventors of the present application have found that when a bias magnetic field is applied to a magnetic field detecting element having such a layer configuration, the magnetization direction of the second magnetic layer is largely rotated while the magnetization direction of the third magnetic layer is not largely changed, and that the magnetization direction of the first magnetic layer is restricted within certain directions by the bias magnetic field. Further, the inventors of the present application have found that when an external magnetic field is applied to the stack in an initial state in which a bias magnetic field is applied, the magnetization direction of the second magnetic layer is moved sensitively around the magnetization direction in the initial state in a direction that is close to the magnetization direction of the first magnetic layer, or in a direction that is apart from the magnetization direction of the first magnetic layer. The relative angle between the magnetization direction of the first magnetic layer and the magnetization direction of the second magnetic layer is thus changed sensitively in accordance with an external magnetic field, and therefore, a large magnetoresistance effect is provided between the first and second magnetic layers by the first non-magnetic intermediate layer, leading to a high magnetoresistance ratio. Further, according to this structure, a reduction in thickness of the stack is facilitated because it is not necessary to provide an antiferromagnetic layer and a synthetic pinned layer in the stack. Furthermore, because the non-magnetic intermediate layer is provided in order to produce a magnetoresistance effect and since the non-magnetic intermediate layer is separately provided in this structure to produce exchange-coupling, optimum material can be used for each non-magnetic intermediate layer. Specifically, the first non-magnetic intermediate layer does not require material to realize exchange-coupling between the first and second magnetic layers, and a wide variety of materials which are capable of limiting the spin-torque effect and of obtaining a high magnetoresistance ratio can be used. Accordingly, limitation of the spin-torque effect is facilitated.

The above and other objects, features and advantages of the present invention will become apparent from the following description with reference to the accompanying drawings which illustrate examples of the present invention.

DESCRIPTION OF PREFERRED EMBODIMENTS

Figure 1:
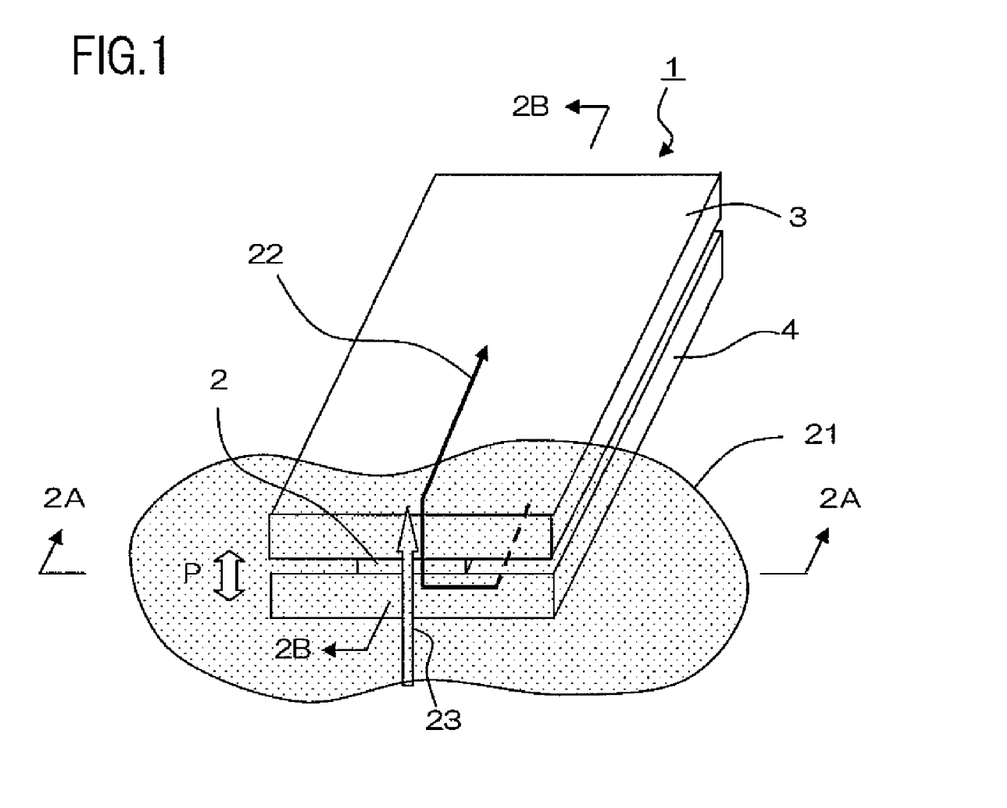
FIG. 1 is a conceptual perspective view of a magnetic field detecting element according to an embodiment of the present invention.
Figure 2A:
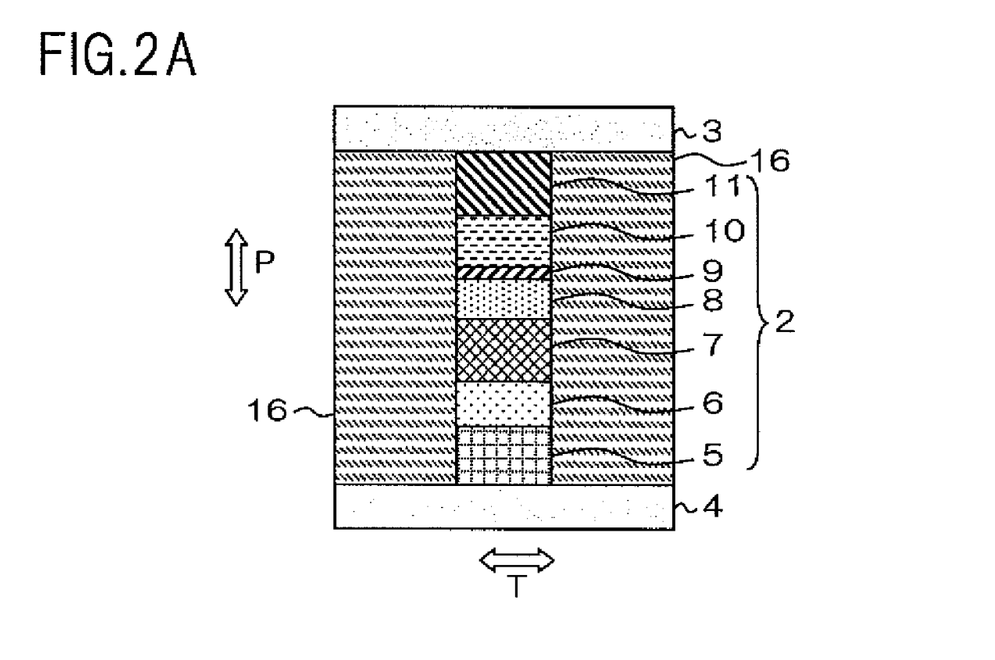
FIG. 2A is a cross sectional view of the magnetic field detecting element when viewed from 2A-2A direction of FIG. 1.
Figure 2B:
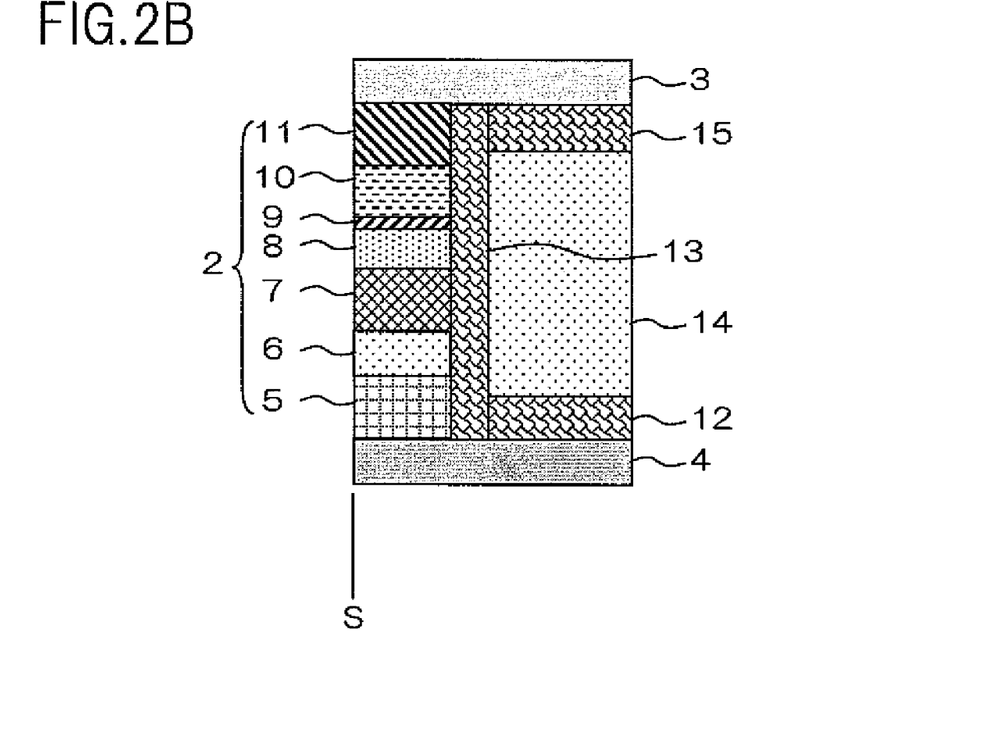
FIG. 2B is a cross sectional view of the magnetic field detecting element along 2B-2B line of FIG. 1.

An embodiment of the present invention will now be described with reference to the attached drawings. A magnetic field detecting element of the present embodiment is particularly suitable for use as a read head portion of a thin film magnetic head of a hard disc drive. FIG. 1 is a conceptual perspective view of a magnetic field detecting element of the present embodiment. FIG. 2A is a side view of the magnetic field detecting element when viewed from 2A-2A direction of FIG. 1, i.e., viewed from the air bearing surface. FIG. 2B is a cross sectional view of the magnetic field detecting element taken along 2B-2B line of FIG. 1. The air bearing surface refers to the surface of magnetic field detecting element 1 that faces recording medium 21.

Magnetic field detecting element 1 includes stack 2, upper shield electrode layer 3 and lower shield electrode layer 4 which are provided such that they sandwich stack 2 in the direction of stacking, bias magnetic layer 14 provided on the side of stack 2 that is opposite to air bearing surface S, and insulating films 16, which are made of, e.g., $Al_2O_3$, provided on both sides of stack 2 with regard to track width direction T.

Stack 2 is sandwiched between upper shield electrode layer 3 and lower shield electrode layer 4 with the tip end thereof exposed at air bearing surface S. Stack 2 is adapted such that sense current 22 is caused to flow in direction P that is perpendicular to the film surface when a voltage is applied between upper shield electrode layer 3 and lower shield electrode layer 4. The magnetic field of recording medium 21 at the position facing stack 2 changes in accordance with the movement of recording medium 21 in moving direction 23. The change in magnetic field is detected as a change in electric resistance which is caused by the magneto-resistance effect. Based on this principle, magnetic field detecting element 1 reads magnetic information that is recorded in each magnetic domain of recording medium 21.

An example of a layer configuration of stack 2 is shown in Table 1. In the table, the layers are shown in the order of stacking, from buffer layer 5 in the bottom column, which is on the side of lower shield electrode layer 4, toward cap layer 9 in the top column, which is on the side of upper shield electrode layer 3. In Table 1, the numerals in the row of "Composition" indicate atomic fractions of the elements. Stack 2 has a layer configuration including buffer layer 5, first magnetic layer 6, first non-magnetic intermediate layer 7, second magnetic layer 8, second non-magnetic layer 9, third magnetic layer 10, and cap layer 11, which are stacked in this order on lower shield electrode layer 4 that is made of an 80Ni20Fe layer having a thickness of about 2 μm.

TABLE 1

| Layer Cinfiguration | Composition | Thickness (nm) |
| --- | --- | --- |
| Cap Layer 11 | Ta | 2 |
| | Ru | 1 |
| Third Magnetic Layer 10 | 90Co10Fe | 4 |
| Second Non-magnetic Intermediate | Ru | 0.6 |

TABLE 1-continued

| Layer Cinfiguration | Composition | Thickness (nm) |
| --- | --- | --- |
| Layer 9 | | |
| Second Magnetic Layer 8 | 30Co70Fe | 2 |
| First Non-magnetic Intermediate Layer 7 | Cu | 0.7 |
| | ZnO | 1.6 |
| | Cu | 0.8 |
| First Magnetic Layer 6 | 30Co70Fe | 2 |
| Buffer Layer 5 | Ru | 2 |
| | Ta | 1 |

Buffer layer 5 is provided as a seed layer for first magnetic layer 6. Both first magnetic layer 6 and second magnetic layer 8, which consist of a CoFe layer, are magnetic layers whose magnetization directions are changed in accordance with an external magnetic field. Instead of the CoFe layer, the layer configuration of 30Co70Fe (thickness 3 nm)/Cu (thickness 0.2 nm)/30Co70Fe (thickness 3 nm), or 30Co70Fe (thickness 3 nm)/Zn (thickness 0.2 nm)/30Co70Fe (thickness 3 nm) may be used. In this specification, the notation of A/B/C . . . indicates that the layers A, B and C are stacked in this order.

First non-magnetic intermediate layer 7 consists of Cu/ZnO/Cu. By providing Cu on both sides of the ZnO layer, the spin-polarization factor at the interfaces between the CoFe layer and the Cu layer is increased, and as a result, the magnetoresistance effect is increased. First non-magnetic intermediate layer 7 may be constituted by a metal, a semiconductor or an insulating material that exhibits a magnetoresistance effect, or may be constituted by a combination of the metal, the semiconductor or the insulating material. Examples of such metals include Cu, An, Ag and Au. Examples of such semiconductors include ZnO, ZnN, SiO, SiN, SiON, SiC, SnO, $In_2O_3$, ITO (Indium-Tin-Oxide) and GaN. Examples of such insulating materials include AlO, MgO, HfO, RuO and $Cu_2O$.

Above second magnetic layer 8, third magnetic layer 10 is provided via second non-magnetic intermediate layer 9 that is sandwiched therebetween. Third magnetic layer 10 is a magnetic layer whose magnetization direction changes in accordance with an external magnetic field. In addition to 90Co10Fe, a CoFe layer having a different composition, the layer configuration of 90Co10Fe (thickness 1 nm)/Cu (thickness 0.2 nm)/90Co10Fe (thickness 1 nm), or 90Co10Fe (thickness 1 nm)/Zn (thickness 0.2 nm)/90Co10Fe (thickness 1 nm) may also be used. The thickness of third magnetic layer 10 is larger than the thickness of second magnetic layer 8. Since the magnetization direction of third magnetic layer 10 is directed in the bias direction by setting the magnetic thickness of third magnetic layer 10 to be large, it is possible to cause the magnetization of second magnetic layer 8 to be anti-parallel to the magnetization direction of first magnetic layer 5 under the bias magnetic field, while third magnetic layer 10 and second magnetic layer 8 are anti-parallel-coupled.

Figure 3:
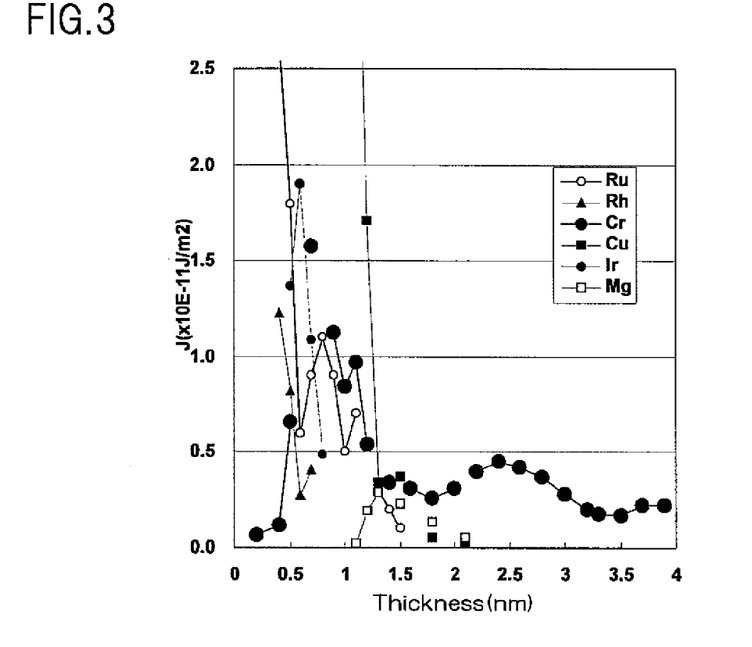
FIG. 3 is a diagram showing the relationship among the materials that are suitably used as the second non-magnetic intermediate layer, the thickness of the materials and the exchange coupling energy.

Second non-magnetic intermediate layer 9 allows second magnetic layer 8 and third magnetic layer 10 to be exchange-coupled such that their magnetization directions are anti-parallel to each other when no magnetic field is applied. Specifically, the material and the thickness of second non-magnetic intermediate layer 9 are selected such that that are RKKY exchange-coupling is realized. The relationship among the materials that are suitably used as the second non-magnetic intermediate layer, the thickness of the materials and the exchange coupling energy is shown in FIG. 3. Cap layer 11 is provided to prevent deterioration of the layers formed beneath. On cap layer 11, upper shield electrode layer 3, which is made of a 80Ni20Fe layer having a thickness of about 2 μm, is formed.

Upper shield electrode layer 3 and lower shield electrode layer 4 function as electrodes for supplying sense current to stack 2 in the direction of stacking P, and also function as shield layers for shielding a magnetic field emitted from adjacent bits on the same track of recording medium 21.

As shown in FIG. 2B, at the portion that is located on the back side of stack 2, when viewed from the air bearing surface, bias magnetic layer 14 is formed via insulating layers 12, 13 and 15. Bias magnetic layer 14 is formed of material, such as CoPt, CoCrPt. Insulating layers 12, 13, 15 consist of $Al_2O_3$, or the like. Bias magnetic layer 14 exerts a bias magnetic field on stack 2 in a direction that is perpendicular to air bearing surface S so as to restrain the magnetization directions of first magnetic layer 6 and third magnetic layer 10. Insulating layers 12, 13, 15 are provided on the lower side, on the lateral side (between bias magnetic layer 14 and stack 2), and on the upper side of bias magnetic layer 14, respectively, thereby to prevent sense current 22 from flowing in bias magnetic layer 14.

Figure 4:
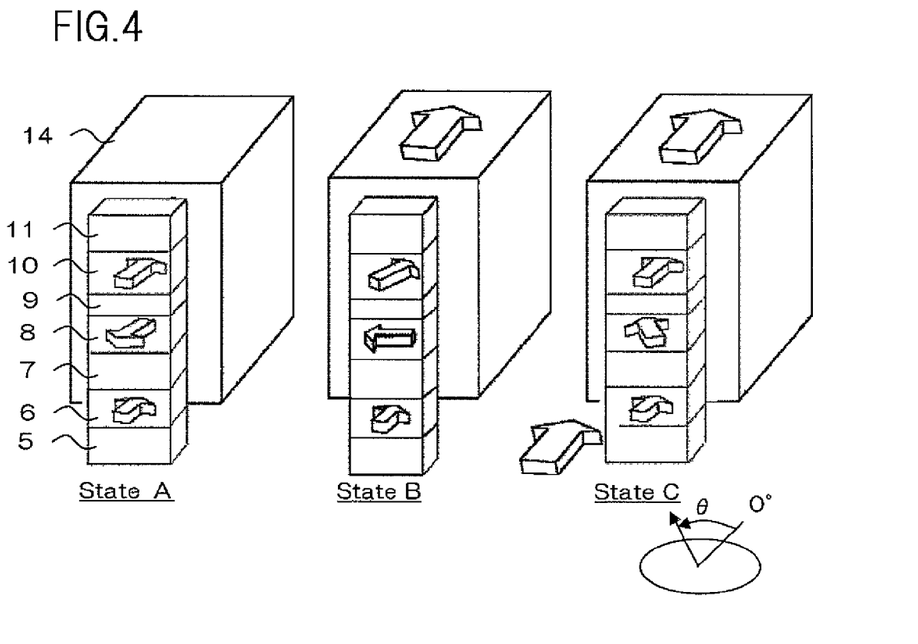
FIG. 4 is a conceptual view showing the magnetization direction of the first to third magnetic layers in typical states.

FIG. 4 is a conceptual view showing the magnetization directions of the first to third magnetic layers in typical states. The magnetization direction is defined such that the direction facing the back side of the figure is zero degree and such that the counterclockwise direction is positive. State A shows the state in which no magnetic field is applied, state B shows the state in which a bias magnetic field is applied, and state C shows the state in which an external magnetic field is applied from a recording medium in addition to the bias magnetic field. In state A in which no magnetic field is applied, second magnetic layer 8 and third magnetic layer 10 are magnetized such that the magnetization directions thereof are in anti-parallel to each other due to the RKKY interaction, as described above.

Figure 5:
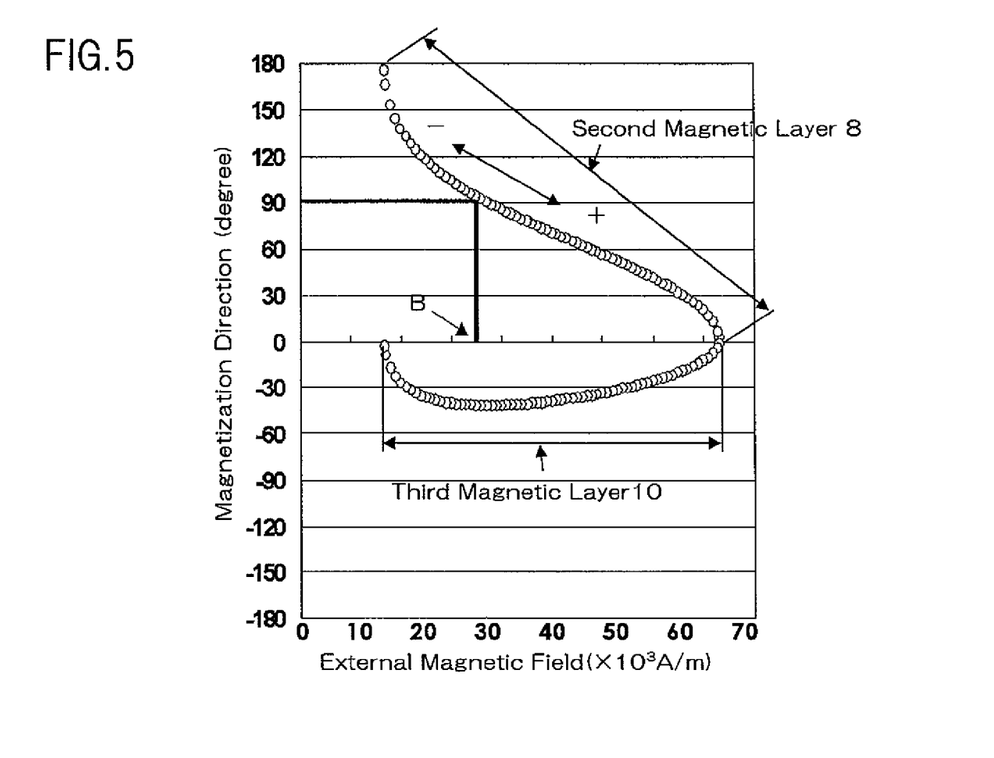
FIG. 5 is a conceptual view showing the magnetization direction of the second and third magnetic layers when an external magnetic field is applied.

However, second magnetic layer 8 and third magnetic layer 10 are actually influenced by a magnetic field emitted from bias magnetic layer 14 because of bias magnetic layer 14 provided near these layers. FIG. 5 is a conceptual diagram showing the magnetization direction of the second and third magnetic layers when an external magnetic field is applied. In FIG. 5, a magnetic field emitted from bias magnetic layer 14 and a magnetic field emitted from the recording medium is not distinguished, and the figure generally illustrates an external magnetic that is produced by a certain cause. When an external magnetic field is applied, the magnetization direction of second magnetic layer 8 is gradually rotated to reach the state in which rotational angle θ is 90 degrees (state B). When the external magnetic field is further increased, rotational angle θ falls below 90 degrees and approaches zero degree (state C). However, the magnetization direction of third magnetic layer 10 stays in the direction of approximately zero degree, only being rotated within the range of about 40 degrees at the most. Moreover, the magnetization direction of first magnetic layer 6 is kept in a direction of approximately zero degree, as described above. This is because there is no magnetic interaction (or no sufficiently small magnetic interaction, if any) between first magnetic layer 6 and second magnetic layer 8, and the magnetization direction depends only on the direction of a magnetic field emitted from bias magnetic layer 14. As a result, the relative angle between the magnetization direction of first magnetic layer 6 and the magnetization direction of second magnetic layer 8 largely changes in accordance with an external magnetic field.

It will be understood that when an external magnetic field is applied from the recording medium in state B, the magnetization direction of second magnetic layer 8 is rotated about the state in which rotational angle θ is 90 degrees. Specifically, when an external magnetic field having the same direction as a magnetic field emitted from bias magnetic layer 14 is applied, the magnetization direction of second magnetic layer 8 is directed in "+" direction in FIG. 5, i.e., in a direction that is close to zero degree (in a direction that is close to the magnetization direction of first magnetic layer 6). On the other hand, when an external magnetic field is applied in a direction opposite to the magnetization direction of the bias magnetic layer, the magnetization direction of second magnetic layer 8 is directed in a "−" direction in FIG. 5, i.e., in a direction that is close to 180 degrees (in a direction that is apart from the magnetization direction of first magnetic layer 6).

Figure 6:
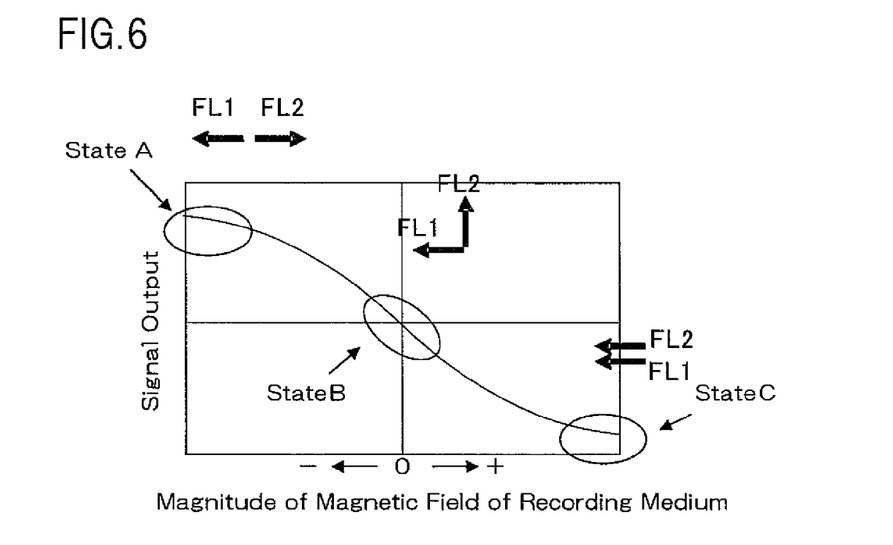
FIG. 6 is a conceptual view showing an operation principle of the magnetic field detecting element shown in FIG. 1.

By making use of the principle described above, the magnetic field detecting element of the present embodiment detects an external magnetic field. FIG. 6 is a conceptual view showing the operation principle of the magnetic field detecting element of the present embodiment. The values on the abscissa indicate the magnitude of an external magnetic field, and values on the ordinate indicate signal output. In the figure, the magnetization direction of second magnetic layer 8 and the magnetization direction of first magnetic layer 6 are indicated by FL1 and FL2, respectively. When an external magnetic field is applied from recording medium 21 in state B, the relative angle between the magnetization direction of second magnetic layer 8 and the magnetization direction of first magnetic layer 6 increases (a state closer to the anti-parallel state) or decreases (a state closer to the parallel state) in accordance with the direction of the magnetic field. If the state comes close to the anti-parallel state, then electrons emitted from the electrode are apt to be scattered, leading to an increase in electric resistance of the sense current. If the state comes close to the parallel state, then electrons emitted from electrode are less apt to be scattered, leading to a decrease in the electric resistance of the sense current. In this way, by utilizing the change in the relative angle between the magnetization direction of second magnetic layer 8 and the magnetization direction of first magnetic layer 6, an external magnetic field can be detected.

Referring again to FIG. 5, rotational angle θ is changed at a high rate in accordance with a change in an external magnetic field is in state B. This implies that a large change in electric resistance is obtained in accordance with a change in the external magnetic field. Moreover, rotational angle θ is changed in accordance with a change in an external magnetic field in a pattern that is linear and substantially symmetrical with respect to state B. This implies that good linearity and good characteristics of asymmetry are realized. Therefore, state B indicates an ideal initial state. As will be clear from the explanation described above, the magnetization direction of second magnetic layer 8 can be controlled by adjusting the magnitude of the magnetic field emitted from bias magnetic layer 14. In the present embodiment, a bias magnetic field of 23000 A/m (about 300 Oe) is applied in order to realize state B.

The exchange-coupling constant of second non-magnetic intermediate layer 9 is preferably within the range of $1\times10^{-13}$ $J/m^2$ to $2\times10^{-11}$ $J/m^2$. When the exchange-coupling constant is $1\times10^{-13}$ $J/m^2$, the above-mentioned ideal initial state can be obtained by applying a bias magnetic field of about 1600 A/m (about 20 Oe). However, since this magnitude of the bias magnetic field is substantially equal to the coercive force of the first to third magnetic layers, the first to third magnetic layers do not respond to the bias magnetic field if the exchange-coupling constant falls below this magnitude. On the other hand, when the exchange-coupling constant is $2\times10^{-11}$ J/m$^2$, the above-mentioned ideal initial state can be obtained by applying a bias magnetic field of about 320000 A/m (about 4 kOe). However, since this magnitude of the bias magnetic field corresponds to coercive force of the bias magnetic layer, it is difficult to apply a bias magnetic field that exceeds this magnitude, because materials used for the bias magnetic layer are limited.

As described above, the magnetoresistance effect occurs mainly between first magnetic layer 6 and second magnetic layer 8. What is important is that first non-magnetic intermediate layer 7 does not need to produce the RKKY interaction in the present embodiment. First non-magnetic intermediate layer 7 can be selected among materials that are capable of achieving a large magnetoresistance effect and that are capable of limiting the spin-torque effect. Although the RKKY interaction is required in order to obtain the magnetic characteristic of second magnetic layer 8 that is shown in FIG. 5, the RKKY interaction occurs between second magnetic layer 8 and third magnetic layer 10 via second non-magnetic intermediate layer 9. In other words, two non-magnetic intermediate layers 7, 9 can be constituted by materials that are best suited to satisfy the functions of the respective layers. Accordingly, limitation on the spin-torque effect is facilitated.

Figure 7A:
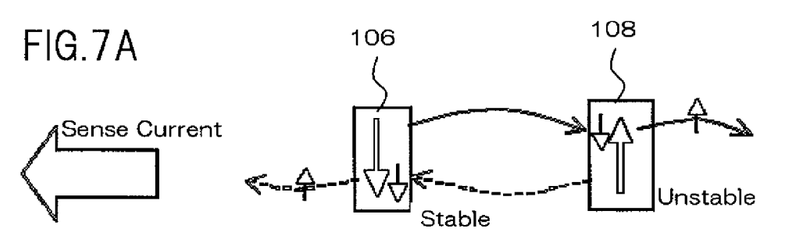
FIGS. 7A to 7D are conceptual views showing the reason why the spin-torque effect is limited.

In the present embodiment, the spin-torque effect is limited in two ways. First, the spin-torque effect is limited due to the layer configuration itself of the stack. FIG. 7A is a conceptual view illustrating the spin-torque effect in a conventional CPP-type element provided with two free layers (first and second magnetic layers). Illustration of layers other than the free layers is omitted. In FIGS. 7A to 7D, the direction of stacking corresponds to the right-left direction in the figures and sense current flows towards left in the figures. The longitudinal large arrows indicate the magnetization direction of each layer, and small longitudinal arrows indicate the spin polarization direction of each layer.

First magnetic layer 106 is magnetized downward in the figure, while second magnetic layer 108 is magnetized upward in the figure. First, electrons that carry sense current flow into first magnetic layer 106. Since first magnetic layer 106 is magnetized downward, electrons that are spin-polarized downward are emitted from first magnetic layer 106, and are injected into second magnetic layer 108. However, since second magnetic layer 108 is magnetized upward in the figure, the magnetization direction of second magnetic layer 108 gradually becomes unstable under the influence of the electrons that are spin-polarized downward. When current density is increased, the magnetization direction of second magnetic layer 108 is finally reversed downward in the figure. Thus, the magnetization of second magnetic layer 108 results in an unstable state.

Figure 7B:
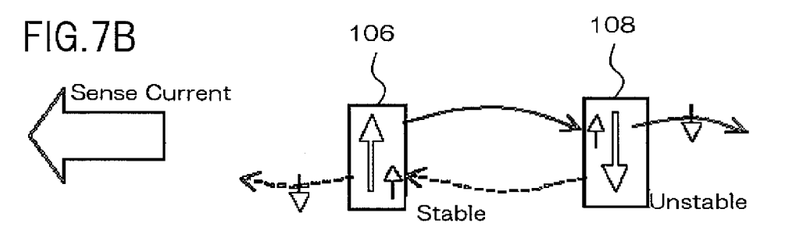

FIG. 7B shows a state in which first magnetic layer 106 is magnetized upward in the figure while second magnetic layer 108 is magnetized downward in the figure. As is similar in this case, since the direction of the spin polarization of electrons and the magnetization direction of second magnetic layer 108 are different from each other, the magnetization of second magnetic layer 108 results in an unstable state in a similar manner. These states tend to occur, for example, when Cu is used as the non-magnetic intermediate layer between first magnetic layer 106 and second magnetic layer 108 and a large amount of sense current of $10^8$ A/cm$^2$ or more flows.

Figure 7C:
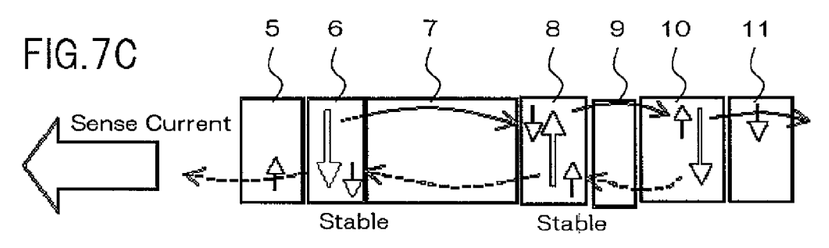

FIG. 7C is a conceptual diagram illustrating the spin-torque effect in the present embodiment. In FIG. 7C, first magnetic layer 6 is magnetized downward in the figure, while second magnetic layer 8 is magnetized upward in the figure, as is similar to FIG. 7A. As described above, third magnetic layer 10, which is magnetized downward in this figure for simplicity, is magnetized substantially in the same direction as first magnetic layer 6. First, electrons flow into first magnetic layer 6. Since first magnetic layer 6 is magnetized downward, electrons that are spin-polarized downward are emitted from first magnetic layer 6, and are injected into second magnetic layer 8. On the other hand, electrons that are spin-polarized upward are emitted from second magnetic layer 8, and are injected into third magnetic layer 10. When spin polarization that is caused by the spin injected from first magnetic layer 6 to second magnetic layer 8 occurs, another spin injection effect having an opposite spin move occurs in second magnetic layer 8 due to the angular momentum conservation law of spin (the broken lines in the figure). As a result, the spin injection effect that is caused by the spin injected from first magnetic layer 6 and the spin injection effect that is caused by the spin injected from third magnetic layer 10 cancel each other out, and accordingly, the spin-torque effect that is exerted on second magnetic layer 8 is limited.

Figure 7D:
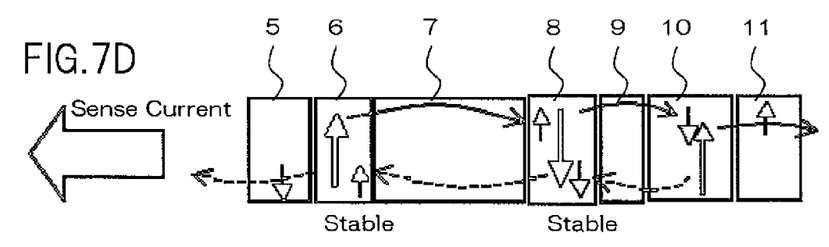

FIG. 7D is a conceptual diagram illustrating the spin-torque effect in the present embodiment. In FIG. 7D, first magnetic layer 6 is magnetized upward in the figure, and second magnetic layer 8 is magnetized downward in the figure, similar to FIG. 7B. Similarly in this case, the spin injection effect that is caused by the spin injected from first magnetic layer 6 and the spin injection effect that is caused by the spin injected from third magnetic layer 10 cancel each other out, and accordingly, the spin-torque effect that is exerted on second magnetic layer 8 is limited.

Figure 8:
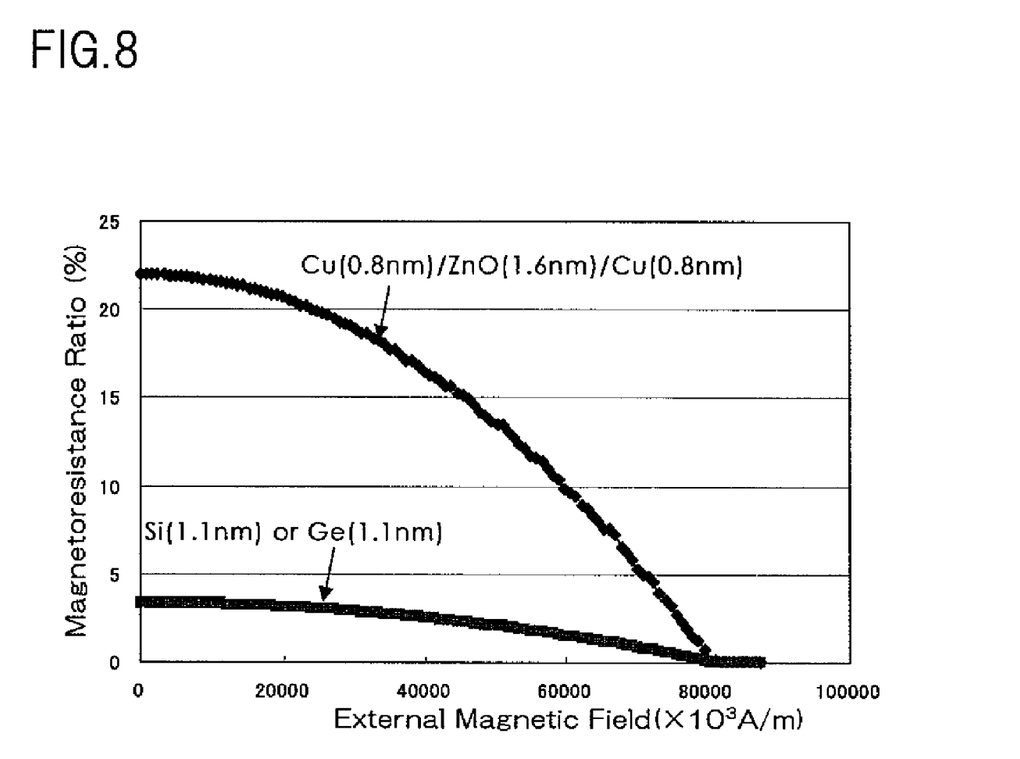
FIG. 8 is a diagram showing the difference between the magnetoresistance ratio when Cu/ZnO/Cu is used as the first non-magnetic intermediate layer and the magnetoresistance ratio when Si or Ge is used as the first non-magnetic intermediate layer.

The second reason why the spin-torque effect is limited is because of the layer configuration of non-magnetic intermediate layer 7. As described above, first non-magnetic intermediate layer 7 has a configuration in which Cu layers are formed on both sides of ZnO. Since ZnO is a semiconductor, first non-magnetic intermediate layer 7 has a larger specific resistance than second non-magnetic intermediate layer 9, and therefore, the current density of sense current is limited. The spin-torque effect is also limited by this effect. Although ZnO does not have a function to produce the RKKY interaction, this does not become a problem for the reason described above. It should be noted that the Cu/ZnO/Cu layer is material that also excels in improving the magnetoresistance ratio. FIG. 8 shows the difference between a magnetoresistance ratio when Cu/ZnO/Cu is used as the first non-magnetic intermediate layer and a magnetoresistance ratio when Si or Ge is used as the first non-magnetic intermediate layer. In particular, Cu/ZnO/Cu exhibits a large magnetoresistance ratio when an external magnetic field is not large.

In the present embodiment, the following advantages can be further provided. First, since it is not necessary to provide an antiferromagnetic layer and a synthetic pinned layer in the stack, a reduction in thickness of the stack is facilitated, which contributes to a further improvement in track recording density. Moreover, in the conventional CPP elements, only the inner pinned layer of the synthetic pinned layer directly contributes to a change in magnetic resistance. The outer pinned layer and the antiferromagnetic layer do not contribute to a change in magnetic resistance, but rather constitute a cause that obstructs improvement in the magnetic resistance ratio. However, in the present embodiment, since the outer pinned layer and the antiferromagnetic layer are unnecessary, and therefore, parasitic resistance is decreased, there is large potential of further improvement in the magnetic resistance ratio.

The magnetic field detecting element of the present embodiment can be manufactured by a method described below. First, lower shield electrode layer 4 is prepared on a substrate. Next, each layer that constitutes stack 2 is formed on lower shield electrode layer 4 by means of sputtering. Next, the layers are formed into a shape by patterning, and portions on both sides with regard to track width direction T are filled with insulating films 16. Thereafter, by using milling, the stack is removed except for the portion whose height corresponds to the height of the element when measured from air bearing surface S, and then bias magnetic layer 14 is formed. As a result of the above-mentioned steps, insulating films 16 are formed on both sides of stack 2 with regard to track width direction T, and bias magnetic layer 14 is formed at the position that is located on the back side of stack 2 when viewed from air bearing surface S. Thereafter, upper shield electrode 3 is formed.

It should be noted that the magnetic field detecting element according to the present invention is not limited to the arrangement shown in Table 1. For example, a layer configuration in which first magnetic layer 6 in Table 1 and third magnetic layer 10 in Table 1 are interchanged with each other is possible. An exemplary layer configuration of this type is shown in Table 2.

TABLE 2

| Layer Cinfiguration | Composition | Thickness (nm) |
| --- | --- | --- |
| Cap Layer 11 | Ta | 2 |
|  | Ru | 1 |
| First Magnetic Layer 6a | 30Co70Fe | 2 |
| First Non-magnetic Intermediate Layer 7a | Cu | 0.7 |
|  | ZnO | 1.6 |
|  | Cu | 0.8 |
| Second Magnetic Layer 8a | 30Co70Fe | 2 |
| Second Non-magnetic Intermediate Layer 9a | Ru | 0.6 |
| Third Magnetic Layer 10a | 90Co10Fe | 4 |
| Buffer Layer 5 | Ru | 2 |
|  | Ta | 1 |

In this embodiment, second magnetic layer 8a and third magnetic layer 10a are magnetically coupled with each other by the RKKY interaction, while first magnetic layer 6a and second magnetic layer 8a are not magnetically coupled with each other. The explanation above described also applies to this embodiment, and an external magnetic field can be detected by utilizing the change in the relative angle between the magnetization direction of the first magnetic layer and the magnetization direction of the second magnetic layer. In summary, first magnetic layer and third magnetic layer may be positioned on one side and on the other side of second magnetic layer, respectively, sandwiching second magnetic layer. Whether which one of first magnetic layer and third magnetic layer is positioned on the upper side or on the lower side with respect to the direction of stacking does not matter.

Figure 9:
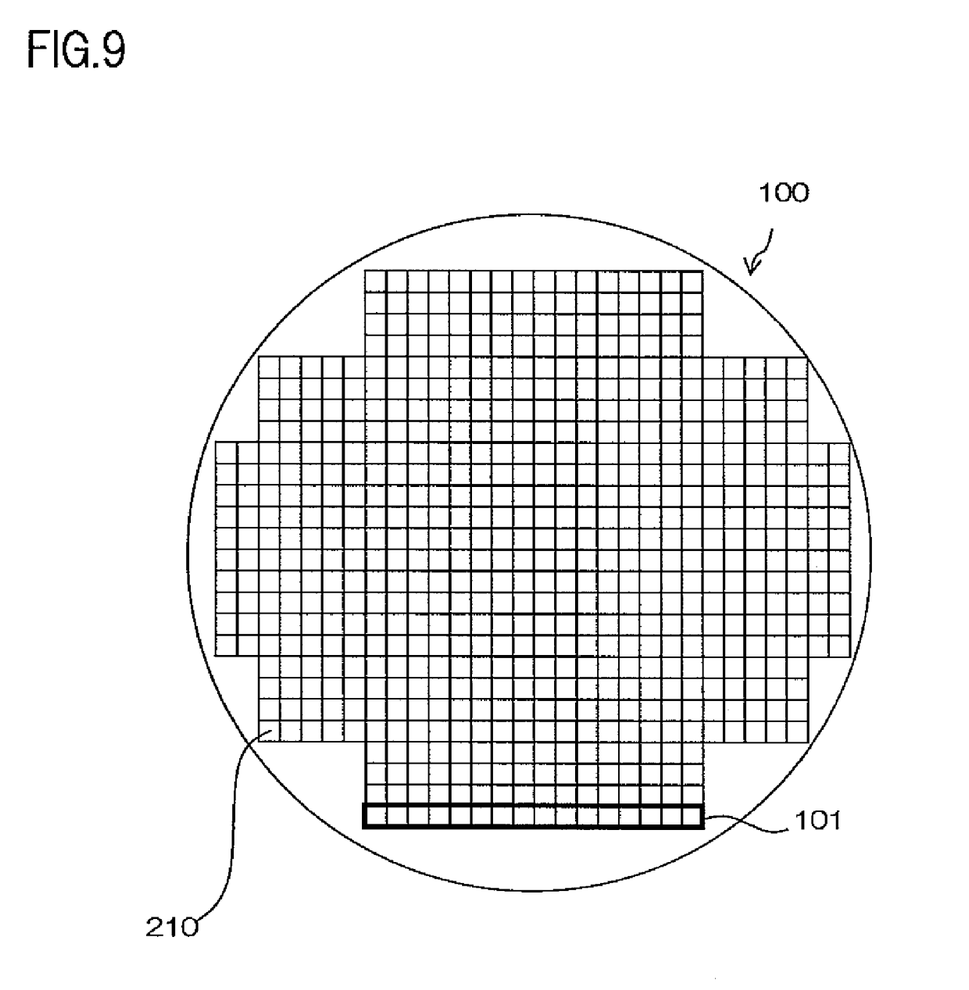
FIG. 9 is a plan view of a wafer which is used to manufacture the magnetic field detecting element of the present invention.

Next, explanation will be made regarding a wafer for fabricating a magnetic field detecting element described above. FIG. 9 is a schematic plan view of a wafer. Wafer 100 has a stack which is deposited thereon to form at least the magnetic field detecting element. Wafer 100 is diced into bars 101 which serve as working units in the process of forming air bearing surface ABS. After lapping, bar 101 is diced into sliders 210 which include thin-film magnetic heads. Dicing portions, not shown, are provided in wafer 100 in order to dice wafer 100 into bars 101 and into sliders 210.

Figure 10:
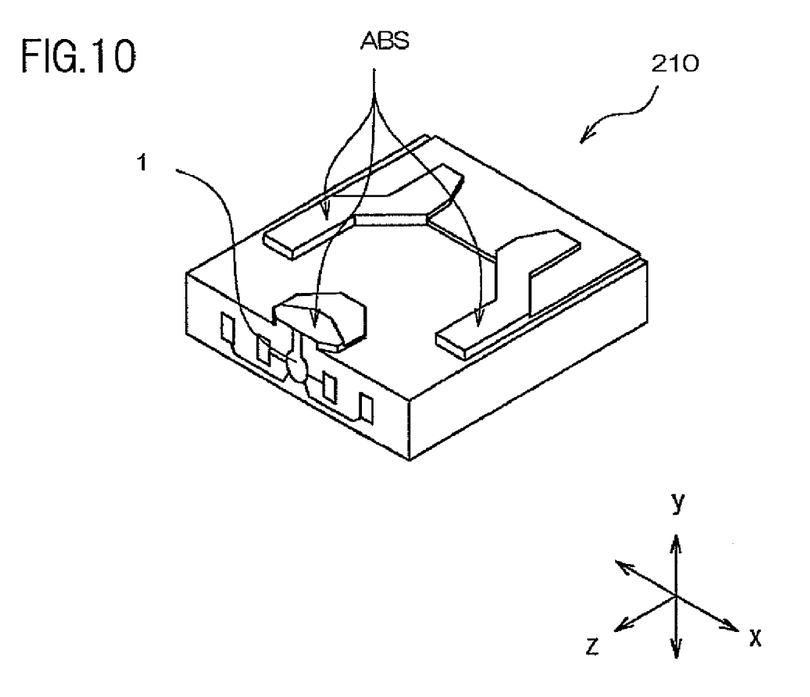
FIG. 10 is a perspective view of a slider of the present invention.

Referring to FIG. 10, slider 210 has a substantially hexahedral shape. One of the six surfaces of slider 210 forms air bearing surface ABS, which is positioned opposite to the hard disk.

Figure 11:
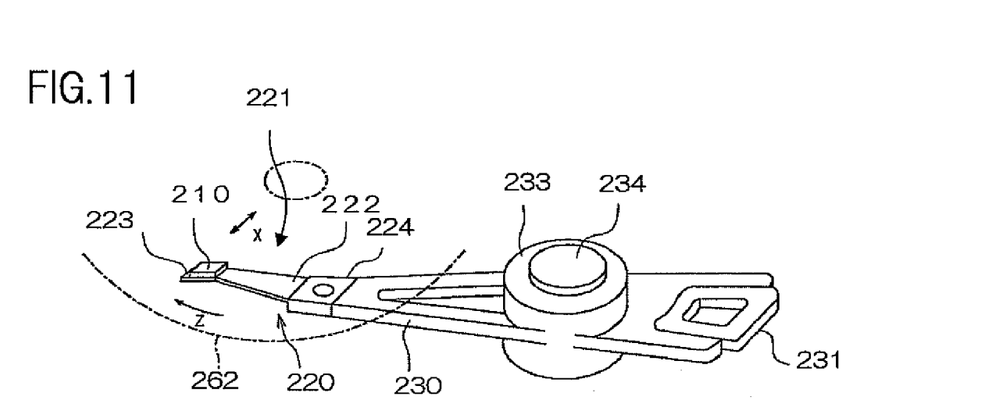
FIG. 11 is a perspective view of a head arm assembly which includes a head gimbal assembly which incorporates a slider of the present invention.

Referring to FIG. 11, head gimbal assembly 220 has slider 210 and suspension 221 for resiliently supporting slider 210. Suspension 221 has load beam 222 in the shape of a flat spring and made of, for example, stainless steel, flexure 223 that is attached to one end of load beam 222, and base plate 224 provided on the other end of load beam 222. Slider 210 is fixed to flexure 223 to provide slider 210 with an appropriate degree of freedom. The portion of flexure 223 to which slider 210 is attached has a gimbal section for maintaining slider 210 in a fixed orientation.

Slider 210 is arranged opposite to a hard disk, which is a rotationally-driven disc-shaped storage medium, in a hard disk drive. When the hard disk rotates in the z direction shown in FIG. 11, airflow which passes between the hard disk and slider 210 creates a dynamic lift, which is applied to slider 210 downward in the y direction. Slider 210 is configured to lift up from the surface of the hard disk due to this dynamic lift effect. Magnetic field detecting element 1 is formed in proximity to the trailing edge (the end portion at the lower left in FIG. 10) of slider 210, which is on the outlet side of the airflow.

The arrangement in which a head gimbal assembly 220 is attached to arm 230 is called head arm assembly 221. Arm 230 moves slider 210 in transverse direction x with regard to the track of hard disk 262. One end of arm 230 is attached to base plate 224. Coil 231, which constitutes a part of a voice coil motor, is attached to the other end of arm 230. Bearing section 233 is provided in the intermediate portion of arm 230. Arm 230 is rotatably held by shaft 234 which is attached to bearing section 233. Arm 230 and the voice coil motor to drive arm 230 constitute an actuator.

Figure 12:
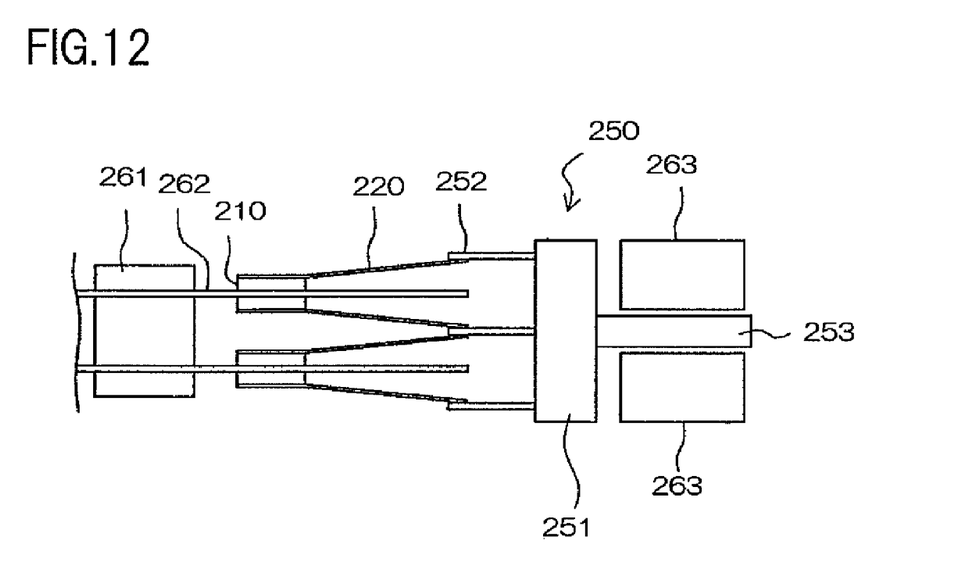
FIG. 12 is a side view of a head arm assembly which incorporates sliders of the present invention.
Figure 13:
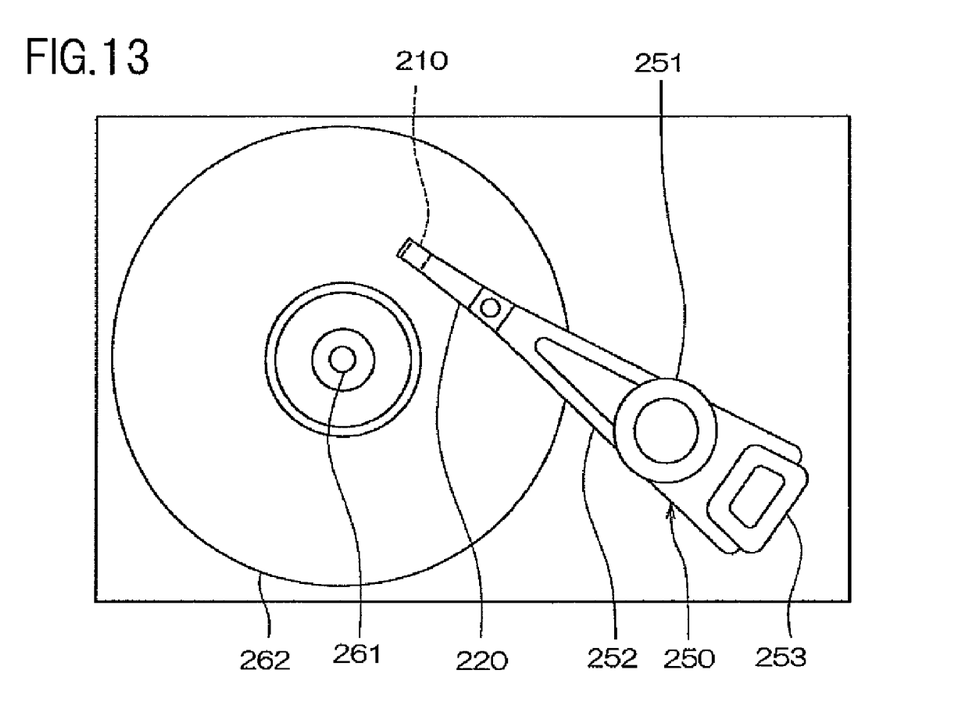
FIG. 13 is a plan view of a hard disk drive which incorporates sliders of the present invention.

Referring to FIG. 12 and FIG. 13, a head stack assembly and a hard disk drive that incorporate the slider mentioned above will be explained next. The arrangement in which head gimbal assemblies 220 are attached to the respective arm of a carriage having a plurality of arms is called a head stack assembly. FIG. 12 is a side view of a head stack assembly, and FIG. 13 is a plan view of a hard disk drive. Head stack assembly 250 has carriage 251 provided with a plurality of arms 252. Head gimbal assemblies 220 are attached to arms 252 such that head gimbal assemblies 220 are arranged apart from each other in the vertical direction. Coil 253, which constitutes a part of the voice coil motor, is attached to carriage 251 on the side opposite to arms 252. The voice coil motor has permanent magnets 263 which are arranged in positions that are opposite to each other and interpose coil 253 therebetween.

Referring to FIG. 13, head stack assembly 250 is installed in a hard disk drive. The hard disk drive has a plurality of hard disks which are connected to spindle motor 261. Two sliders 210 are provided per each hard disk 262 at positions which are opposite to each other and interpose hard disk 262 therebetween. Head stack assembly 250 and the actuator, except for sliders 210, work as a positioning device in the present invention. They carry sliders 210 and work to position sliders 210 relative to hard disks 262. Sliders 210 are moved by the actuator in the transverse direction with regard to the tracks of hard disks 262, and positioned relative to hard disks 262. Magnetic field detecting element 1 that is included in slider 210 writes information to hard disk 262 by means of the write head portion, and reads information recorded in hard disk 262 by means of the read head portion.

Although certain preferred embodiments of the present invention have been shown and described in detail, it should be understood that various changes and modifications may be made without departing from the spirit or scope of the appended claims.

The invention claimed is:

1. A magnetic field detecting element comprising:
    a stack which includes first, second and third magnetic layers whose magnetization directions change in accordance with an external magnetic field, said second magnetic layer being positioned between said first magnetic layer and said third magnetic layer, a first non-magnetic intermediate layer which is sandwiched between said first magnetic layer and said second magnetic layer, said first non-magnetic intermediate layer producing a magnetoresistance effect between said first magnetic layer and said second magnetic layer, and a second non-magnetic intermediate layer which is sandwiched between said second magnetic layer and said third magnetic layer, said second non-magnetic intermediate layer allowing said second magnetic layer and said third magnetic layer to be exchange-coupled such that magnetization directions thereof are anti-parallel to each other under no magnetic field, said stack being adapted such that sense current flows in a direction that is perpendicular to a film surface thereof; and
    a bias magnetic layer which is provided on a side of said stack, the side being opposite to an air bearing surface of said stack, said bias magnetic layer applying a bias magnetic field to said stack in a direction that is perpendicular to the air bearing surface.

2. The magnetic field detecting element according to claim 1, wherein said first, second and third magnetic layers are stacked in an order of said first, second and third magnetic layers.

3. The magnetic field detecting element according to claim 1, wherein said first, second and third magnetic layers are stacked in an order of said third, second and first magnetic layers.

4. The magnetic field detecting element according to claim 1, wherein said first non-magnetic intermediate layer includes metallic material, insulating material or semiconductor or a combination thereof which produces a magnetoresistance effect between said first and said second magnetic layers.

5. The magnetic field detecting element according to claim 1, wherein said third insulating layer has a larger thickness than said second insulating layer.

6. The magnetic field detecting element according to claim 1, wherein an exchange coupling constant of said second non-magnetic intermediate layer ranges from $1 \times 10^{-13}$ J/m$^2$ to $2 \times 10^{-11}$ J/m$^2$.

7. The magnetic field detecting element according to claim 1, wherein said first non-magnetic intermediate layer has a larger specific resistance than said second non-magnetic intermediate layer.

8. A slider including the magnetic field detecting element according to claim 1.

9. A head gimbal assembly including the slider according to claim 8, and a suspension for elastically supporting the slider.

10. A hard disc drive including the slider according to claim 8, and a device for supporting the slider and for positioning the slider with respect to a recording medium.

11. A wafer having the stack that is to be formed into the magnetic field detecting element according to claim 1.

* * * * *